United States Patent
Kadowaki et al.

(10) Patent No.: US 10,328,548 B2
(45) Date of Patent: Jun. 25, 2019

(54) POLISHING-LAYER MOLDED BODY, AND POLISHING PAD

(71) Applicant: KURARAY CO., LTD., Kurashiki-shi (JP)

(72) Inventors: Kiyofumi Kadowaki, Kurashiki (JP); Shinya Kato, Kurashiki (JP); Chihiro Okamoto, Kurashiki (JP); Mitsuru Kato, Kurashiki (JP); Minori Takegoshi, Kurashiki (JP)

(73) Assignee: KURARAY CO., LTD., Kurashiki-shi (JP)

(*) Notice: Subject to any disclaimer, the term of this patent is extended or adjusted under 35 U.S.C. 154(b) by 224 days.

(21) Appl. No.: 15/524,339

(22) PCT Filed: Nov. 12, 2015

(86) PCT No.: PCT/JP2015/005640
§ 371 (c)(1),
(2) Date: May 4, 2017

(87) PCT Pub. No.: WO2016/084321
PCT Pub. Date: Jun. 2, 2016

(65) Prior Publication Data
US 2017/0334034 A1    Nov. 23, 2017

(30) Foreign Application Priority Data

Nov. 28, 2014  (JP) .................. 2014-241409

(51) Int. Cl.
*B24B 37/24*    (2012.01)
*H01L 21/304*    (2006.01)
*B24B 37/26*    (2012.01)

(52) U.S. Cl.
CPC .............. *B24B 37/24* (2013.01); *B24B 37/26* (2013.01); *H01L 21/304* (2013.01)

(58) Field of Classification Search
CPC ........ B24B 37/24; B24B 37/26; H01L 21/304
(Continued)

(56) References Cited

U.S. PATENT DOCUMENTS 6,095,902 A * 8/2000 Reinhardt ............... B24B 37/24
                                                              451/120
6,736,709 B1 * 5/2004 James .................... B24B 37/26
                                                              451/287

(Continued)

FOREIGN PATENT DOCUMENTS

EP    1 354 913 A1    10/2003
JP    11-322878 A     11/1999
(Continued)

OTHER PUBLICATIONS

International Search Report dated Jan. 26, 2016 in PCT/JP2015/005640 Filed Nov. 12, 2015.

*Primary Examiner* — Robert Rose
(74) *Attorney, Agent, or Firm* — Oblon, McClelland, Maier & Neustadt, L.L.P.

(57) ABSTRACT

Disclosed is a polishing-layer molded body including: a thermoplastic polyurethane that is a polymer of a monomer including: a polymer diol; an organic diisocyanate; a first chain extender including a diol having 4 or less carbon atoms; a second chain extender including a diol having 5 or more carbon atoms, a content ratio of nitrogen derived from an isocyanate group of the organic diisocyanate being 6.3 to 7.4 mass %, and the polishing-layer molded body being non-porous.

12 Claims, 3 Drawing Sheets

(58) Field of Classification Search
USPC .......... 451/526, 527, 533, 534; 51/297, 298, 51/293
See application file for complete search history.

(56) References Cited

U.S. PATENT DOCUMENTS

| | | | |
|---|---|---|---|
| 6,860,802 B1* | 3/2005 | Vishwanathan | B24B 37/042 451/527 |
| 2009/0096856 A1 | 4/2009 | Kimura | |
| 2009/0298392 A1 | 12/2009 | Okamoto et al. | |
| 2011/0171890 A1* | 7/2011 | Nakayama | B24B 37/24 451/526 |
| 2012/0083187 A1 | 4/2012 | Okamoto et al. | |
| 2014/0024296 A1* | 1/2014 | Muncy | B24B 37/26 451/42 |
| 2014/0154962 A1 | 6/2014 | Takeuchi et al. | |

FOREIGN PATENT DOCUMENTS

| | | |
|---|---|---|
| JP | 2000-178374 A | 6/2000 |
| JP | 2000-248034 A | 9/2000 |
| JP | 2001-89548 A | 4/2001 |
| JP | 2002-371154 A | 12/2002 |
| JP | 2004-35669 A | 2/2004 |
| JP | 2004-123975 A | 4/2004 |
| JP | 2008-235508 A | 10/2008 |
| JP | 2009-78332 A | 4/2009 |
| JP | 2009-101487 A | 5/2009 |
| JP | 2014-38916 A | 2/2014 |
| WO | 2007/034980 A1 | 3/2007 |
| WO | WO2013/011922 A1 | 1/2013 |

* cited by examiner

POLISHING-LAYER MOLDED BODY, AND POLISHING PAD

TECHNICAL FIELD

The present invention relates to a polishing-layer molded body that is used as a polishing layer of a polishing pad for polishing a semiconductor wafer, a semiconductor device, a silicon wafer, a hard disk, a glass substrate, an optical product, or various metals or the like.

BACKGROUND ART

Chemical mechanical polishing (CMP) is known as a polishing method used for mirror finishing a semiconductor wafer, and planarizing the surface of an insulating film and a conductive film of a semiconductor device. CMP is a method in which the surface of a material to be polished such as a wafer is polished with a polishing pad by using a polishing slurry (hereinafter also simply referred to as "slurry") containing abrasive grains and a reaction liquid.

Conventionally, a non-woven fabric-type polishing pad has been widely used as the polishing pad for CMP. The non-woven fabric-type polishing pad is a flexible polishing pad including a non-woven fabric impregnated with polyurethane. Due to its flexibility, the non-woven fabric-type polishing pad also has an advantage of having good contact with a material to be polished. Also, it has an advantage of having good slurry retention because the non-woven fabric has voids. On the other hand, the non-woven fabric-type polishing pad has a disadvantage of exhibiting a low performance in planarizing a surface to be polished (hereinafter referred to as "planarization performance") due to its flexibility. The non-woven fabric-type polishing pad also has a disadvantage that scratching is likely to occur on the surface to be polished when the voids of the non-woven fabric are clogged by abrasive grains and polishing debris. Another disadvantage is that abrasive grains and polishing debris cannot be sufficiently removed by washing when they have entered deeply into the voids of the non-woven fabric, resulting in a short life.

A polishing pad composed mainly of a polymer foam is also known as a polishing pad of a type different from the non-woven fabric-type polishing pad. The polishing pad composed mainly of a polymer foam has a higher hardness than the non-woven fabric-type polishing pad, and thus exhibits an excellent planarization performance. Since the polishing pad composed mainly of a polymer foam has a closed-cell structure, abrasive grains and polishing debris will not enter deeply into the voids unlike the case of the non-woven fabric-type polishing pad. Therefore, abrasive grains and polishing debris can be relatively easily removed by washing, resulting in a relatively long life. As the polishing pad composed mainly of a polymer foam, for example, polishing pads as disclosed in PTLs 1 to 6 below are known that include, as a polishing layer, a foamed polyurethane molded body obtained by foaming and molding a two-liquid curable polyurethane by casting. There is also known a polishing pad including a thermoplastic foamed polyurethane molded body as a polishing layer, as described in PTL 7 below.

Semiconductor devices include integrated circuits with a high level of integration and multilayered interconnections. Polishing pads used for a planarization process for semiconductor devices are required to exhibit a higher planarization performance. A polishing pad that exhibits a high planarization performance offers a high polishing rate for a portion to be polished, and a low polishing rate for a portion that is not to be polished. The polishing pad that exhibits a high planarization performance is required to have a high hardness. A polishing pad including a foamed polyurethane molded body as a polishing layer exhibits a high planarization performance because the polishing layer has a relatively high hardness.

With a further increase in the level of integration and the number of multilayered interconnections in semiconductor devices in recent years, there is a need for a polishing pad that exhibits an even higher planarization performance. In the case of using a polishing pad including a foamed polyurethane molded body as a polishing layer, it has been difficult to achieve a high planarization performance by further increasing the hardness of the polishing layer. In order to provide a polishing pad that offers an even higher planarization performance, for example, PTLs 8 and 9 below disclose high-hardness polishing pads including a non-porous thermoplastic polyurethane molded body as a polishing layer.

CITATION LIST

Patent Literatures

[PTL 1] Japanese Laid-Open Patent Publication No. 2000-178374
[PTL 2] Japanese Laid-Open Patent Publication No. 2000-248034
[PTL 3] Japanese Laid-Open Patent Publication No. 2001-89548
[PTL 4] Japanese Laid-Open Patent Publication No. H11-322878
[PTL 5] Japanese Laid-Open Patent Publication No. 2002-371154
[PTL 6] WO 2007/034980
[PTL 7] Japanese Laid-Open Patent Publication No. 2004-35669
[PTL 8] Japanese Laid-Open Patent Publication No. 2014-038916
[PTL 9] Japanese Laid-Open Patent Publication No. 2009-101487

SUMMARY OF INVENTION

Technical Problem

With the conventional polishing pads including a non-porous thermoplastic polyurethane molded body as a polishing layer, it has been difficult to achieve both a high moldability and a high planarization performance.

It is an object of the present invention to provide a polishing-layer molded body having both a high moldability and a high planarization performance.

Solution to Problem

According to an aspect of the present invention, there is provided a polishing-layer molded body including: a thermoplastic polyurethane that is a polymer of a monomer including: a polymer diol; an organic diisocyanate; a first chain extender including a diol having 4 or less carbon atoms; a second chain extender including a diol having 5 or more carbon atoms, a content ratio of nitrogen derived from an isocyanate group of the organic diisocyanate being 6.3 to 7.4 mass %, and the polishing-layer molded body being non-porous. The above-described thermoplastic polyurethane has a high moldability. Furthermore, a non-porous thermoplastic polyurethane molded body has a high hardness, and thus achieve a high planarization performance when used as a polishing layer.

It is preferable that the first chain extender includes at least one selected from the group consisting of ethylene glycol, 1,3-propanediol, 1,2-butanediol, 1,3-butanediol, 2,3-butanediol, 1,4-butanediol, and 2-methyl-1,3-propanediol, and the second chain extender includes at least one selected from the group consisting of 1,5-pentanediol, 2,2-dimethyl-propane-1,3-diol, 3-methyl-1,5-pentanediol, 1,6-hexanediol, cyclohexanediol, 1,8-octanediol, cyclohexanedimethanol, 1,9-nonanediol, 2-methyl-1,8-octanediol, and 1,10-decanediol.

It is preferable that the thermoplastic polyurethane has an endothermic peak at 185° C. or less as measured by differential scanning calorimetry (DSC), and has a crystallization enthalpy ($\Delta H$) of 2 to 15 J/g as determined from an endothermic peak area at the endothermic peak, from the viewpoint of a particularly excellent moldability.

It is preferable that the polishing-layer molded body includes the first chain extender and the second chain extender that have a difference in number of carbon atoms of 2 or more, from the viewpoint of a particularly excellent moldability.

It is preferable that the polishing-layer molded body the polishing-layer molded body has a density of 1.0 g/cm$^3$ or more and a JIS-D hardness of 75 or more, from the viewpoint of a particularly excellent planarization performance.

It is preferable that the polishing-layer molded body the polishing-layer molded body includes a surface having a contact angle with water of 75 degrees or less, since scratching is less likely to occur in a surface to be polished.

It is preferable that the thermoplastic polyurethane has a tensile modulus at 50° C. when swollen to saturation with 50° C. warm water, of 250 to 1500 MPa, since a polishing layer that can maintain a hardness high enough to prevent the occurrence of scratching can be obtained.

It is preferable that the thermoplastic polyurethane has a storage modulus retention when swollen to saturation with water, of 55% or more, as calculated from the following expression: A/B×100, where A represents a storage modulus at 50° C. when swollen to saturation with 50° C. warm water, and B represents a storage modulus at 50° C. when not swollen to saturation with 50° C. warm water, since the polishing characteristics are less likely to change over time during polishing.

It is preferable that the polymer diol contains at least one selected from the group consisting of polyethylene glycol, polypropylene glycol, polytetramethylene glycol, and polymethyltetramethylene glycol, from the viewpoint of excellent hydrophilicity.

It is preferable that the polishing-layer molded body includes a polishing surface having a recess, and the recess has a tapered corner portion extending toward the polishing surface, since burrs are less likely to be generated at the corner portions of the recess during polishing.

According to another aspect of the present invention, there is provided a polishing pad including any of the above-described polishing-layer molded bodies as a polishing layer. With such a polishing pad, it is possible to achieve polishing with excellent polishing uniformity.

It is preferable that a cushioning layer having a hardness lower than a hardness of the polishing layer is stacked thereon, since a polishing pad that is well-balanced in the global planarization performance and the local planarization performance can be obtained.

Advantageous Effects of Invention

According to the present invention, it is possible to obtain a polishing-layer molded body that has an excellent moldability and achieves a high planarization performance when used as a polishing layer.

DESCRIPTION OF EMBODIMENT

Figure 1:
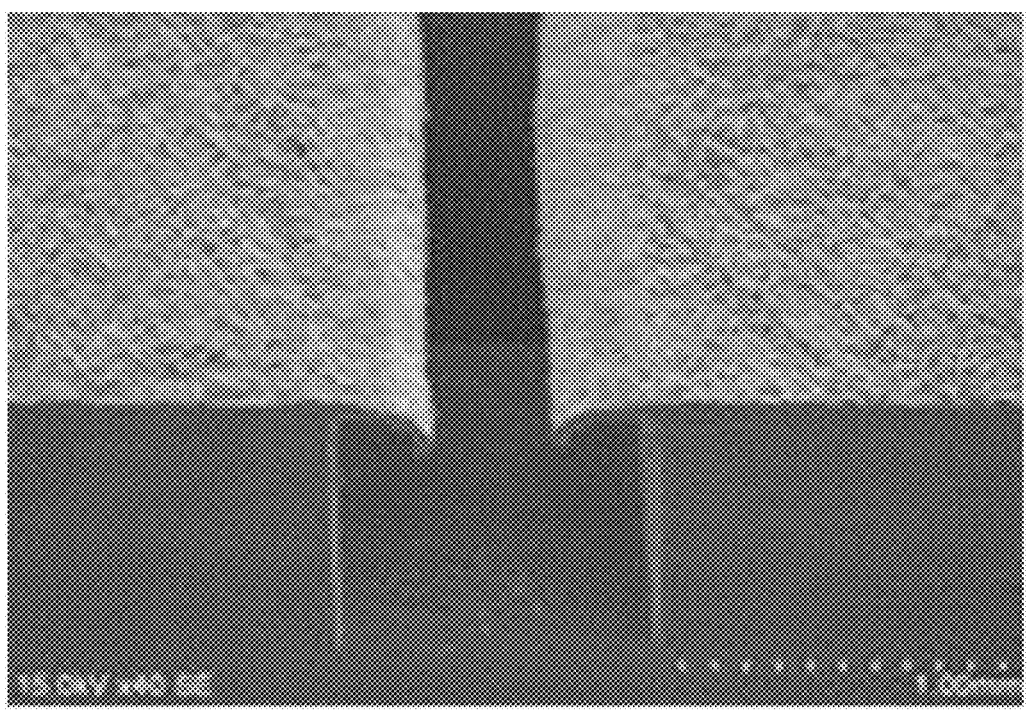
FIG. 1 is a scanning electron microscope (SEM) photograph showing an example of burrs generated at corner portions of a recess of a polishing layer.

Hereinafter, a polishing-layer molded body and a polishing pad according to an embodiment of the present invention will be described in detail.

The polishing-layer molded body of the present embodiment is a thermoplastic polyurethane molded body including: a thermoplastic polyurethane that is a polymer of a monomer including: a polymer diol; an organic diisocyanate; a first chain extender including a diol having 4 or less carbon atoms; a second chain extender including a diol having 5 or more carbon atoms, a content ratio of nitrogen derived from an isocyanate group of the organic diisocyanate being 6.3 to 7.4 mass %, and the polishing-layer molded body being non-porous.

Examples of the polymer diol include polyether diol, polyester diol, and polycarbonate diol.

Examples of the polyether diol include polyethylene glycol, polypropylene glycol, polytetramethylene glycol, polymethyltetramethylene glycol, polyoxypropylene glycol, and glycerin-based polyalkylene ether glycol. These may be used alone or in a combination of two or more.

Examples of the polyester diol include a polyester diol obtained by a direct esterification reaction or a transesterification reaction between a dicarboxylic acid or an ester-forming derivative thereof (e.g., an ester, anhydride, etc.) and a low-molecular weight diol.

Specific examples of the dicarboxylic acid include aliphatic dicarboxylic acids, including, for example, C2-12 aliphatic dicarboxylic acids such as oxalic acid, succinic acid, glutaric acid, adipic acid, pimelic acid, suberic acid, azelaic acid, sebacic acid, dodecanedicarboxylic acid, 2-methylsuccinic acid, 2-methyladipic acid, 3-methyladipic acid, 3-methylpentanedioic acid, 2-methyloctanedioic acid, 3,8-dimethyldecanedioic acid and 3,7-dimethyldecanedioic acid; and also C14-48 dimerized aliphatic dicarboxylic acids (dimer acids) obtained by the dimerization of unsaturated fatty acids obtained by the fractional distillation of triglycerides, as well as the hydrogenated products from these C14-48 dimerized aliphatic dicarboxylic acids (hydrogenated dimer acids); alicyclic dicarboxylic acids such as 1,4-cyclohexanedicarboxylic acid; and aromatic dicarboxylic acids such as terephthalic acid, isophthalic acid and ortho-phthalic acid. Examples of the dimer acid and the hydrogenated dimer acid include "Pripol 1004", "Pripol 1006", "Pripol 1009", and "Pripol 1013" (trade names, manufactured by Unichema). These may be used alone or in a combination of two or more.

Specific examples of the low-molecular weight diol include aliphatic diols such as ethylene glycol, 1,3-propanediol, 1,2-propanediol, 2-methyl-1,3-propanediol, 1,4-butanediol, neopentyl glycol, 1,5-pentanediol, 3-methyl-1,5-pentanediol, 1,6-hexanediol, 1,7-heptanediol, 1,8-octanediol, 2-methyl-1,8-octanediol, 1,9-nonanediol and 1,10-decanediol; and alicyclic diols such as cyclohexanedimethanol and cyclohexanediol. These may be used alone or in a combination of two or more. Among these, C6-12 diols are preferable, C8-10 diols are more preferable, and C9 diols are particularly preferable.

Examples of the polycarbonate diol include a polycarbonate diol obtained by reaction between a carbonate compound and a low-molecular weight diol.

Specific examples of the carbonate compound include dialkyl carbonates such as dimethyl carbonate and diethyl carbonate, alkylene carbonates such as ethylene carbonate, and diaryl carbonates such as diphenyl carbonate. Examples of the low-molecular weight diol include the same low-molecular weight diols as those described above. These may be used alone or in a combination of two or more.

The polymer diols may be used alone or in a combination of two or more. Among these, it is particularly preferable to use at least one selected from the group consisting of polyethylene glycol, polypropylene glycol, polytetramethylene glycol, and polymethyltetramethylene glycol, or derivatives thereof, since they have excellent hydrophilicity.

The number average molecular weight of the polymer diol is, but not particularly limited to, preferably 600 to 1400, more preferably 600 to 1200, particularly preferably 600 to 1000. When the number average molecular weight of the polymer diol is too low, the planarization performance of the polishing layer tends to be reduced as a result of the reduction in hardness or tensile modulus. On the other hand, when the number average molecular weight of the polymer diol is too high, a thermoplastic polyurethane molded body having a low impact resilience and a high toughness can be more easily obtained. In a polishing layer using a thermoplastic polyurethane molded body having a low impact resilience and a high toughness, burrs tend to be generated during polishing at corner portions (end portions, shoulder portions) of recesses in the case of forming the recesses on the polishing surface. The number average molecular weight of the polymer diol is a value calculated based on the hydroxyl value measured in accordance with JIS K 1557.

Examples of the organic diisocyanate include aliphatic or alicyclic diisocyanates such as ethylene diisocyanate, tetramethylene diisocyanate, pentamethylene diisocyanate, hexamethylene diisocyanate, 2,2,4- or 2,4,4-trimethylhexamethylene diisocyanate, dodecamethylene diisocyanate, isophorone diisocyanate, isopropylidenebis(4-cyclohexyl isocyanate), cyclohexylmethane diisocyanate, methylcyclohexane diisocyanate, 4,4'-dicyclohexylmethane diisocyanate, lysine diisocyanate, 2,6-diisocyanatomethyl caproate, bis(2-isocyanatoethyl)fumarate, bis(2-isocyanatoethyl)carbonate, 2-isocyanatoethyl-2,6-diisocyanatohexanoate, cyclohexylene diisocyanate, methylcyclohexylene diisocyanate and bis(2-isocyanatoethyl)-4-cyclohexene; and aromatic diisocyanates such as 2,4'- or 4,4'-diphenylmethane diisocyanate, 2,4- or 2,6-tolylene diisocyanate, m- or p-phenylene diisocyanate, m- or p-xylylene diisocyanate, 1,5-naphthylene diisocyanate, 4,4'-diisocyanatobiphenyl, 3,3'-dimethyl-4,4'-diisocyanatobiphenyl, 3,3'-dimethyl-4,4'-diisocyanatodiphenylmethane, chlorophenylene-2,4-diisocyanate and tetramethylxylylene diisocyanate. These may be used alone or in a combination of two or more. Among these, at least one selected from the group consisting of 4,4'-diphenylmethane diisocyanate, 2,4-tolylene diisocyanate, 2,6-tolylene diisocyanate and isophorone diisocyanate is preferable, and 4,4'-diphenylmethane diisocyanate is particularly preferable, since a polishing layer having excellent abrasion resistance can be provided.

The monomer used for the polymerization of the thermoplastic polyurethane contains a first chain extender that is a diol having 4 or less carbon atoms, and a second chain extender that is a diol having 5 or more carbon atoms. When only a diol having 4 or less carbon atoms is used as a chain extender, the number of hydrogen bonds between a —NH group and a —CO group in the molecular chain is increased to form a dense net-like structure, so that a thermoplastic polyurethane having a high hardness and a high strength can be more easily obtained. However, the melting point and the crystallinity are increased to reduce the moldability of the thermoplastic polyurethane. When a diol having 4 or less carbon atoms and a diol having 5 or more carbon atoms are used in combination as chain extenders, the interval between ester and a urethane group is increased, so that the aggregation density between the molecular chains is moderately decreased to reduce the melting point and the crystallinity, thus making it possible to obtain a thermoplastic polyurethane having an excellent moldability.

Specific examples of the first chain extender that is a diol having 4 or less carbon atoms include C2 diols such as ethylene glycol; C3 diols such as 1,3-propanediol; and C4 diols such as butanediols (e.g., 1,2-butanediol, 1,3-butanediol, 2,3-butanediol, and 1,4-butanediol) and 2-methyl-1,3-propanediol.

Examples of the second chain extender that is a diol having 5 or more carbon atoms include C5 diols such as 1,5-pentanediol and 2,2-dimethylpropane-1,3-diol; C6 diols such as 3-methyl-1,5-pentanediol, 1,6-hexanediol, and cyclohexanediol; C8 diols such as 1,8-octanediol and cyclohexanedimethanol; C9 diols such as 1,9-nonanediol and 2-methyl-1,8-octanediol; and C10 diols such as 1,10-decanediol.

The content ratio between the first chain extender that is a diol having 4 or less carbon atoms and the second chain extender that is a diol having 5 or more carbon atoms is not particularly limited, and may be adjusted according to the balance between the moldability and the hardness. For example, preferably 0.09 to 0.67 moles, more preferably 0.25 to 0.54 moles of the second chain extender is blended, per mole of the first chain extender. When the ratio of the second chain extender is too low, the effect of improving the moldability of the thermoplastic polyurethane tends to be insufficient. When the ratio of the second chain extender is too high, the hardness of the thermoplastic polyurethane tends to be reduced.

It is preferable that the first chain extender that is a diol having 4 or less carbon atoms and the second chain extender that is a diol having 5 or more carbon atoms have a difference in number of carbon atoms of 2 or more, since a thermoplastic polyurethane having an excellent moldability can be obtained.

As the chain extenders used for the polymerization of the thermoplastic polyurethane, as long as the effects of the present invention will not be impaired, it is possible to further use, in addition to the first chain extender and the second chain extender, a low-molecular weight compound that has been conventionally used for the polymerization of a thermoplastic polyurethane and has, in the molecule, two or more active hydrogen atoms capable of reacting with an isocyanate group.

The blending ratio of the polymer diol, the chain extenders, and the organic diisocyanate as the components used for the polymerization of the thermoplastic polyurethane may be appropriately selected taking into consideration the desired physical properties such as abrasion resistance. Specifically, for example, the ratio is preferably such that the amount of the isocyanate group contained in the organic diisocyanate is preferably 0.95 to 1.3 moles, more preferably 0.96 to 1.10 moles, particularly preferably 0.97 to 1.05 moles, per mole of the active hydrogen atoms contained in the polymer diol and the chain extenders, from the viewpoint of excellent mechanical strength and abrasion resistance of the thermoplastic polyurethane as well as excellent productivity and storage stability of the thermoplastic polyurethane. When the ratio of the isocyanate group is too low, the mechanical strength and abrasion resistance of the thermoplastic polyurethane molded body tend to be reduced. When the ratio of the isocyanate group is too high, the productivity and storage stability of the thermoplastic polyurethane tend to be reduced.

As for the mass ratio of the polymer diol, the organic diisocyanate, and the chain extenders, the ratio of the amount of the polymer diol to the total amount of the organic diisocyanate and the chain extenders is preferably 15/85 to 45/55, more preferably 20/80 to 40/60, particularly preferably 25/75 to 35/65.

The thermoplastic polyurethane is obtained by polymerization through a urethanation reaction using a known prepolymer method or one-shot method by using a monomer containing a polymer diol, an organic diisocyanate, a first chain extender including a diol having 4 or less carbon atoms, and a second chain extender including a diol having 5 or more carbon atoms. It is preferable to use a method in which continuous melt-polymerization is performed substantially in the absence of a solvent by using a single-screw or multi-screw extruder, while melt-mixing the monomer.

The content ratio of nitrogen derived from the organic diisocyanate in the thermoplastic polyurethane is 6.3 to 7.4 mass %, preferably 6.5 to 7.3 mass %, more preferably 6.7 to 7.3 mass %. By adjusting the content ratio of nitrogen derived from the isocyanate group of the organic diisocyanate to 6.3 to 7.4 mass %, the amount of the hard segment in the polyurethane is increased, so that a thermoplastic polyurethane having a high hardness can be obtained. When the content ratio of nitrogen derived from the organic diisocyanate is less than 6.3 mass %, the hardness of the thermoplastic polyurethane is reduced, so that the planarization performance and the polishing efficiency of the resulting polishing layer are reduced. When the content ratio of nitrogen derived from the organic diisocyanate exceeds 7.4 mass %, the hardness of the thermoplastic polyurethane is excessively increased, resulting in a polishing layer that is likely to cause scratching in a surface to be polished.

The thermoplastic polyurethane has an endothermic peak temperature of preferably 185° C. or less, more preferably 180° C. or less, as determined by differential scanning calorimetry (DSC), from the viewpoint of an excellent moldability. Although the lower limit is not particularly limited, the endothermic peak temperature is preferably 160° C., more preferably about 170° C. The crystallization enthalpy ($\Delta H$) as determined from the endothermic peak area at the endothermic peak is preferably 2 to 15 J/g, more preferably 5 to 11 J/g, from the viewpoint of a particularly excellent moldability.

The thermoplastic polyurethane has a contact angle with water of preferably 75 degrees or less, more preferably 70 degrees or less, particularly preferably 65 degrees or less. When the contact angle with water is too high, a polishing layer that is likely to cause scratching in a surface to be polished tend to be obtained.

Furthermore, the thermoplastic polyurethane has a JIS-D hardness of preferably 75 or more, more preferably 80 or more. When the JIS-D hardness is too low, the property of following a surface to be polished is high, so that a polishing layer having a low local planarization performance tends to be obtained.

The density of the thermoplastic polyurethane molded body is preferably 1.0 g/cm$^3$ or more, more preferably 1.1 g/cm$^3$ or more, particularly preferably 1.2 g/cm$^3$ or more. When the density of the thermoplastic polyurethane molded body is too low, a polishing layer having a low local planarization performance tends to be obtained.

The thermoplastic polyurethane has a tensile modulus at 50° C. after swollen to saturation with 50° C. water, of preferably 250 to 1500 MPa, more preferably 400 to 1300 MPa, particularly preferably 600 to 1000 MPa. When the tensile modulus at 50° C. after swollen to saturation with 50° C. water is too low, the polishing layer tends to soften during polishing, resulting in a reduction in the planarization performance and the polishing efficiency. When the tensile modulus at 50° C. after swollen to saturation with 50° C. water is too high, scratching tends to easily occur in a surface to be polished.

The thermoplastic polyurethane has a storage modulus retention when swollen to saturation with water of preferably 55% or more, more preferably 60% or more, particularly preferably 75% or more, the storage modulus retention being calculated by the expression (1): A/B×100, where A represents a storage modulus at 50° C. when swollen to saturation with 50° C. warm water, and B represents a storage modulus at 50° C. when not swollen to saturation with 50° C. warm water. When the storage modulus retention when swollen to saturation with water is too low, the polishing layer undergoes significant changes in characteristics due to moisture. For example, the polishing rate tends to be easily reduced when the polishing pad is left in a damp state for several hours to several days after polishing has been finished.

Note that the storage modulus at 50° C. when not swollen to saturation refers to a storage modulus at 50° C., as measured immediately after adjusting the state of a test piece by leaving the test piece at 23° C. and 65% RH for 3 days, without causing the test piece to be swollen to saturation with 50° C. warm water. The storage modulus at 50° C. when not swollen to saturation is preferably 600 to 1900 MPa, more preferably 800 to 1700 MPa. When the storage modulus at 50° C. is too low, the polishing uniformity tends to be reduced. When it is too high, the number of scratches tends to increase.

The thermoplastic polyurethane molded body of the present embodiment is a non-porous (unfoamed) molded body. Such a non-porous thermoplastic polyurethane molded body has a high hardness, and thus achieves a high planarization performance when used as a polishing layer. Such a non-porous thermoplastic polyurethane molded body is preferably produced in the form of a sheet by subjecting a thermoplastic polyurethane free of components such as a foaming agent to extrusion molding by using a T-die or injection molding. In particular, a sheet obtained by extrusion molding using a T-die is preferable since a sheet having a uniform thickness can be obtained.

The thickness of the polishing-layer molded body is not particularly limited, and may be appropriately adjusted according to the layer configuration or the usage of the polishing pad. Specifically, the thickness is preferably 1.5 to 3.0 mm, more preferably 1.7 to 2.8 mm, particularly preferably 2.0 to 2.5 mm.

The polishing pad of the present embodiment may be either a monolayer polishing pad directly using a polishing-layer molded body shaped into a predetermined shape, or a multilayer polishing pad in which a cushioning layer is further stacked on a polishing layer constituted by the polishing-layer molded body.

It is preferable that the cushioning layer has a hardness lower than the hardness of the polishing layer. When the hardness of the cushioning layer is lower than the hardness of the polishing layer, the hard polishing layer is likely to follow local irregularities on a surface to be polished, and therefore, the cushioning layer follows the warpage and undulations on the entire material to be polished, making it possible to achieve polishing that is well-balanced in the global planarization performance and the local planarization performance.

Specific examples of materials that can be used as the cushioning layer include composites obtained by impregnating a known non-woven fabric with a polyurethane; rubbers such as natural rubber, nitrile rubber, polybutadiene rubber and silicone rubber; thermoplastic elastomers such as polyester thermoplastic elastomers, polyamide thermoplastic elastomers and fluorine thermoplastic elastomers; foamed plastics; and polyurethanes. Among these, a polyurethane having a foam structure is particularly preferable because of its moderate flexibility.

The thickness of the cushioning layer is not particularly limited, and is preferably about 0.3 to 1.2 mm, more preferably about 0.5 to 1.0 mm, for example. When the cushioning layer is too thin, the effect of following the warpage and undulations on the entire material to be polished tends to be reduced, resulting in a reduction in the global planarization performance of the polishing pad. On the other hand, when the cushioning layer is too thick, the polishing pad as a whole will become soft, making it difficult for polishing to be performed in a stable manner.

Usually, recesses such as grooves or holes are formed, for example, concentrically in the polishing-layer molded body of the present embodiment in order to allow a slurry to be uniformly and sufficiently supplied to the polishing surface. Such recesses are also useful to discharge polishing debris that may cause scratching and prevent a damage to a wafer as a result of absorption of the polishing pad.

The method for forming the recesses in the polishing surface is not particularly limited. Examples thereof include a method in which the surface of the polishing-layer molded body is subjected to cutting so as to form a predetermined pattern of recesses, a method in which recesses are formed by performing transferring using a mold during injection molding, and a method in which recesses are formed by stamping using a heated die.

For example, in the case of forming grooves concentrically, the interval between the grooves is preferably about 2.0 to 50 mm, more preferably about 5.5 to 30 mm, particularly preferably about 6.0 to 15 mm. The width of the grooves is preferably about 0.1 to 3.0 mm, more preferably about 0.4 to 2.0 mm. The depth of the grooves is preferably about 0.2 to 1.8 mm, more preferably about 0.4 to 1.5 mm. The cross-sectional shape of the grooves may be appropriately selected from, for example, a rectangular shape, a trapezoidal shape, a triangular shape, and a semicircular shape according to the purpose.

Figure 2:
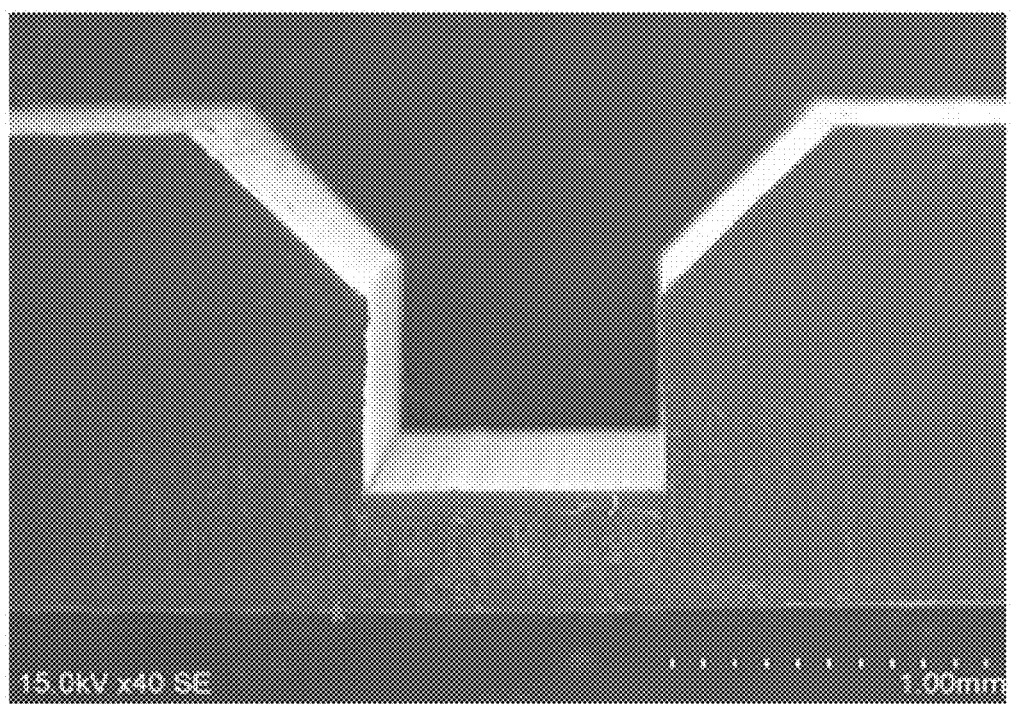
FIG. 2 is a scanning electron microscope (SEM) photograph showing an example of a groove including tapered corner portions extending toward a polishing surface in a polishing layer of a polishing pad.

In the case where recesses are formed in the polishing surface of the polishing-layer molded body, burrs may be generated at corner portions (shoulder portions, end portions) of the recesses as shown in FIG. 1 as a result of a material to be polished or a conditioner repeatedly coming into contact with the corner portions for a long period of time. Such burrs gradually clog the recesses, which gradually reduces the amount of slurry supplied. This results in a gradual reduction in the polishing rate and the polishing uniformity. In such a case, it is preferable that, as shown in FIG. 2, a tapered corner portion having a cut-off cross section is formed at at least one of the corner portions of a recess. Such a tapered corner portion constitutes a surface that is inclined relative to a direction perpendicular to the polishing surface. By forming such a tapered shape at at least one of the corner portions of a recess, the generation of burrs that may clog the recess is suppressed even when the polishing-layer molded body is used for polishing for a long period of time.

Figure 3:
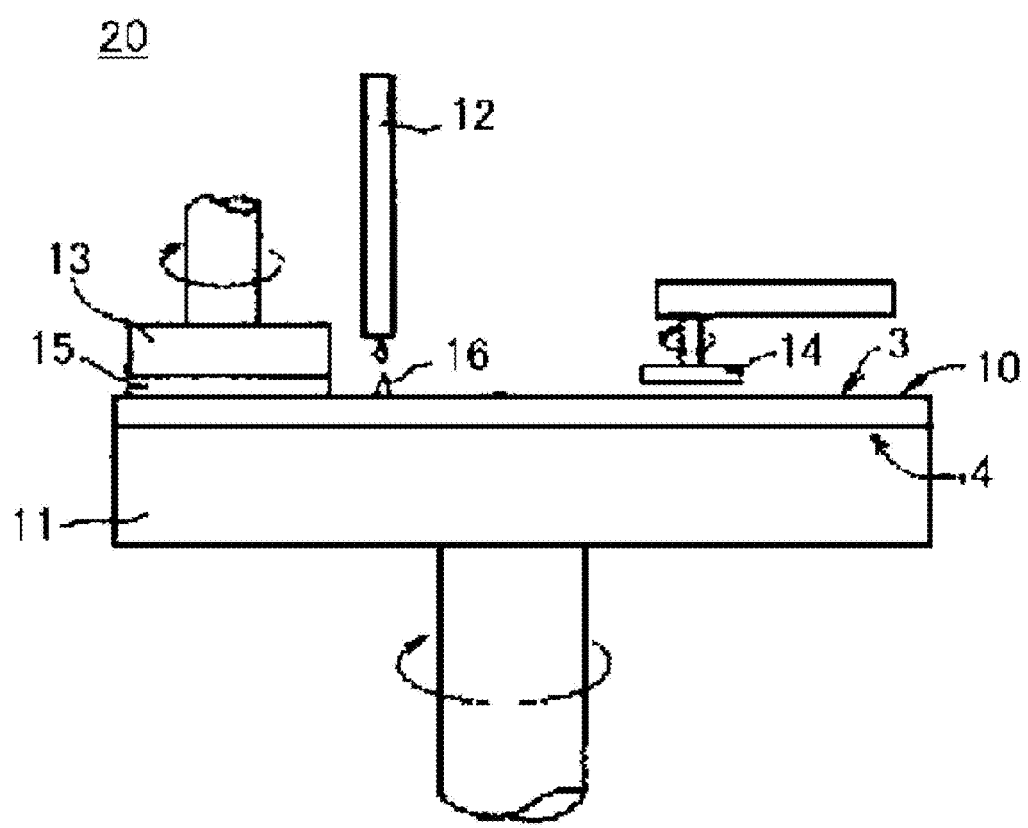
FIG. 3 is an explanatory diagram illustrating CMP using a polishing pad according to the present embodiment.

An embodiment of CMP using a polishing pad including the polishing-layer molded body of the present embodiment as a polishing layer will be described. In CMP, a CMP apparatus 20 including a circular rotary platen 11, a slurry supply nozzle 12, a carrier 13, and a pad conditioner 14 as shown in FIG. 3 is used, for example. A polishing pad 10 is attached to the surface of the rotary platen 11 by means of double-sided tape or the like. The carrier 13 supports a material to be polished 15.

In the CMP apparatus 20, the rotary platen 11 is rotated by a motor (not shown) in the direction indicated by the arrow. The carrier 13 is rotated, in the plane of the rotary platen 11, by a motor (not shown), for example, in the direction indicated by the arrow. The pad conditioner 14 is also rotated, in the plane of the rotary platen 11, by a motor (not shown), for example, in the direction indicated by the arrow.

First, while pouring distilled water onto a polishing surface of a polishing layer of the polishing pad 10 that is fixed to the rotary platen 11 and is rotated, the rotating pad conditioner 14 is pressed against the polishing surface of the polishing pad 10 so as to condition the polishing surface. As the pad conditioner, it is possible to use, for example, a conditioner in which diamond particles are fixed onto the surface of a carrier by electrodeposition of nickel or the like. In this manner, the polishing surface is adjusted to have a surface roughness suitable for polishing of a surface to be polished. Next, a polishing slurry 16 is supplied from the slurry supply nozzle 12 to the surface of the rotating polishing pad 10. The polishing slurry 16 contains, for example, a liquid medium such as water or oil; an abrasive such as silica, alumina, cerium oxide, zirconium oxide or silicon carbide; a base, an acid, a surfactant, an oxidizing agent, a reducing agent, and/or a chelating agent. At the time of performing CMP, a lubricating oil, a coolant, and the like may be optionally supplied together with the polishing slurry. Then, the material to be polished 15 that is fixed to the carrier 13 and is rotated is pressed against the polishing surface of the polishing pad 10 that is evenly wetted with the polishing slurry 16. Then, the polishing treatment is continued until a predetermined flatness is achieved. Adjustment of the pressing force applied during polishing or the speed of relative movement between the rotary platen 11 and the carrier 13 affects the finishing quality.

Although the polishing conditions are not particularly limited, the rotational speed of each of the platen and the substrate is preferably as low as 300 rpm or less, in order to efficiently perform polishing. The pressure applied to the substrate is preferably 150 kPa or less, in order to suppress the occurrence of scratching. While polishing is performed, it is preferable that the polishing slurry is continuously supplied to the polishing surface. The amount of the polishing slurry supplied is preferably sufficient to allow the entire polishing surface to be constantly wetted with the polishing slurry.

The CMP according to the present embodiment can be preferably used for polishing performed during the production process of various semiconductor devices, MEMS (MicroElectro Mechanical Systems), and the like. Specific examples of the material to be polished include semiconductor wafers such as a silicon wafer, a silicon oxide wafer and a silicon oxyfluoride wafer; inorganic insulating films formed on a wiring board having predetermined wiring, such as a silicon oxide film, a glass film and a silicon nitride film; films mainly containing polysilicon, aluminum, copper, titanium, titanium nitride, tungsten, tantalum, tantalum nitride and the like; optical glass products such as a photomask, a lens and a prism; inorganic conductive films such as a tin-doped indium oxide (ITO) film; optical integrated circuits, optical switching elements, optical waveguides composed, and end faces of optical fiber composed of glass and a crystalline material; optical single crystals such as a scintillator; solid-state laser single crystals; sapphire substrates for blue laser LEDs; semiconductor single crystals such as silicon carbide, gallium phosphide and gallium arsenide; glass substrates for magnetic disks; magnetic heads and the like; and synthetic resins such as a methacrylate resin and a polycarbonate resin.

EXAMPLES

Hereinafter, the present invention will be described in further detail by way of examples. It should be appreciated that the scope of the invention is by no means limited to the examples.

Example 1

A monomer obtained by mixing a polytetramethylene glycol (PTMG 850) having a number average molecular weight of 850, 1,4-butanediol (BD) serving as a chain extender having 4 carbon atoms, 3-methyl-1,5-pentanediol (MPD) serving as a chain extender having 6 carbon atoms, and 4,4'-diphenylmethane diisocyanate (MDI) at a ratio of PTMG 850:BD:MPD:MDI=19.0:14.7:6.4:59.9 (mass ratio) was provided. Then, the monomer was continuously supplied into a twin-screw extruder by using a metering pump, while being kneaded, and was subjected to continuous melt polymerization, to give a polymer. A strand of the molten polymer continuously discharged from the twin-screw extruder was continuously extruded into water, and was thereafter finely cut with a pelletizer, to give pellets of a thermoplastic polyurethane A. Then, the thermoplastic polyurethane A was evaluated according to the following evaluation methods.

<Measurement of Content Ratio of Nitrogen Derived from Isocyanate Group of Organic Diisocyanate>

First, a total nitrogen content in the thermoplastic polyurethane was calculated by elementary analysis under the following conditions:

Apparatus: Fully automatic elemental analyzer 2400 series II (equipped with an autosampler as standard equipment) C.H.N.S/O analyzer, manufactured by PerkinElmer, Inc.
Electric furnace temperature: 975° C.
Sample amount: 2 mg
Combustion improver: None
Sample container: Tin foil (with combustion improving effect, a single sheet was used)
Standard substance for creating calibration curve: Sulfanilamide Next, each of the nitrogen atoms derived from the isocyanate group of the organic diisocyanate and the nitrogen atoms derived from the chain extenders in the thermoplastic polyurethane A were detected by NMR measurement under the following conditions:

Device: Nuclear magnetic resonance device Lambda 500 manufactured by JEOL, Ltd.
Measurement conditions: Resonance frequency; 1H 500 MHz/Probe; TH5FG2
Solvent: DMSO-d6, Concentration; 5 wt %/vol
Measurement temperature: 80° C.
Number of times of integrations: 64 s Then, from the results of the elementary analysis and the NMR measurement, the content ratio of nitrogen derived from the isocyanate group of the organic diisocyanate was calculated.

<Differential Scanning Calorie (DSC) Measurement>

Using a differential scanning calorimeter ("DSC 30" manufactured by Mettler Co. Ltd.), a crystallization enthalpy ($\Delta H$) was determined from an endothermic peak temperature (° C.) of the thermoplastic polyurethane A and the endothermic peak area at the endothermic peak. The measurement was performed with about 10 mg of a sample, under a nitrogen atmosphere, and a temperature rising rate of 10° C./min.

<Contact Angle with Water>

The thermoplastic polyurethane A was sandwiched between two metal plates, and hot press-molded by using a hot press-molding machine (a bench-type test press manufactured by SHINTO Metal Industries Corporation). In the hot press-molding, preheating was performed at a heating temperature of 230° C. for 2 minutes, and thereafter pressing was performed for 1 minute at a predetermined pressing pressure. Then, the two metal plates with the thermoplastic polyurethane A interposed therebetween were taken out from the hot press-molding machine and cooled, to give a press-molded sheet having a thickness of 300 µm. The, the obtained press-molded sheet was dried in a vacuum drier at 60° C.×for 16 hours. Then, the contact angle with water of the press-molded sheet was measured by using a DropMaster 500 manufactured by Kyowa Interface Science Co., Ltd.

<Density>

A press-molded sheet having a thickness of 2 mm was formed, and the density thereof was measured in accordance with JIS K 7112.

<Hardness>

A press-molded sheet having a thickness of 2 mm was formed, and the hardness (JIS-D hardness) thereof was measured in accordance with JIS K 7311.

<Tensile Modulus at 50° C. when Swollen to Saturation with 50° C. Water>

A press-molded sheet having a thickness of 300 µm was formed. Then, a No. 2-type test piece (JIS K 7113) was punched out from the press-molded sheet having a thickness of 300 µm. Then, the No. 2-type test piece was swollen to saturation with water by being immersed in 50° C. warm water for 48 hours. Then, water was wiped off from the surface of the No. 2-type test piece taken out from the warm water, and thereafter the test piece was left at an ambient temperature of 50° C. for 2 minute. Then, the No. 2-type test piece was mounted to a tensile testing machine (Instron 3367) at a chuck interval of 40 mm, and left at an ambient temperature of 50° C. for 2 minutes, followed by measuring the tensile modulus under the conditions: a tensile speed of 500 mm/min, and N=6.

<Storage Modulus Retention when Swollen to Saturation with Water>

A press-molded sheet having a thickness of 300 μm was formed. Then, a test piece of 5.0×30 (mm) was cut out from the press-molded sheet, and was left for 3 days at 23° C. and 65% RH so as to adjust the state of the test piece. Then, the dynamic viscoelastic modulus at 50° C. of the test piece was measured at a frequency of 11 Hz by using a dynamic viscoelastic measurement device (DVE Rheospectra manufactured by Rheology Co., Ltd.), to determine a storage modulus (B).

Meanwhile, a test piece that had been formed in the same manner was swollen to saturation with water by being immersed in 50° C. warm water for 48 hours. Then, after water was wiped off from the surface of the test piece taken out from the warm water, the dynamic viscoelastic modulus at 50° C. was measured at a frequency of 11 Hz, to determine a storage modulus (A).

Then, assuming that (A) represents the storage modulus of the test piece swollen to saturation with warm water and (B) represents the storage modulus of the test piece not swollen to saturation with warm water, a storage modulus retention when swollen with water was calculated by the following expression (1): A/B×100, where A represents the storage modulus at 50° C. of the test piece swollen to saturation with 50° C. warm water, and B represents the storage modulus at 50° C. of the test piece not swollen to saturation with 50° C. warm water . . . (1).

<Moldability and Polishing Characteristics>

A single-screw extrusion molder (screw diameter: 90 mm) having installed thereto a T-die including a filter having a pressure gauge attached therein was provided. Then, the pellets of the thermoplastic polyurethane A were supplied into the single-screw extrusion molder so as to be discharged from the T-die, and then were passed through a pair of rolls tempered at 60 to 80° C. and having a gap interval of 1.8 mm, to give a non-porous thermoplastic polyurethane sheet having a thickness of 2 mm. The conditions for the single-screw extrusion molder were set such that the charging cylinder temperature was 215 to 240° C., and the die temperature was 230 to 240° C. Then, the moldability at this time was evaluated by the following method.

(Moldability)

A: No unmelts were observed during molding, and there was also no increase in the pressure shown on the pressure gauge.

B: Unmelts were observed during molding, but there was no increase in the pressure shown on the pressure gauge.

C: Unmelts were observed during molding, and there was an increase in the pressure shown on the pressure gauge.

Then, the surface of the obtained thermoplastic polyurethane sheet was ground to give a polishing-layer molded body having a thickness of 1.2 mm. Then, in the main surface, which would serve as a polishing surface, of the polishing-layer molded body having a thickness of 1.2 mm, grooves each having a width of 1 mm and a depth of 1.0 mm were concentrically formed at an interval of 7.5 mm. In addition, at opposite corner portions of each of the concentrically formed grooves, corner portions extending toward the polishing surface and being tapered to have a shape cut out in a rectangular triangle 0.6 mm on a side, as shown in FIG. 2, were formed. Then, the polishing-layer molded body was cut out into a circular shape having a diameter of 38 cm. Then, a cushioning layer was attached to the back surface with a double-sided pressure-sensitive adhesive sheet, to produce a multilayer polishing pad. As the cushioning layer, a "Poron H48" manufactured by the INOAC Corporation, which was a foamed polyurethane sheet having a thickness of 0.8 mm, a JIS-C hardness of 65, and a porosity of 48 vol %, was used. Then, the polishing characteristics of the obtained multilayer polishing pad were evaluated by the following methods.

(Change Over Time of Polishing Rate)

The multilayer polishing pad was fixed to a rotary platen of a CMP polishing device (PPO-60S manufactured by Nomura Machine Tool Works Ltd.), and the polishing surface was ground, using a diamond dresser for 30 minutes at a pressure of 0.18 MPa and a dresser rotation rate of 110 rpm. Note that an MEC10-L manufactured by Mitsubishi Materials Corporation was used as the diamond dresser.

Then, an 8-inch silicon wafer having an oxide film surface was polished, while adding a slurry dropwise onto the polishing surface of the multilayer polishing pad. Note that the polishing was performed under the conditions: a platen rotation rate of 50 rpm, a head rotation rate of 49 rpm, a polishing pressure of 45 kPa, and a polishing time of 100 seconds. As the slurry, a two-fold dilution with distilled water of a polishing slurry SS25 manufactured by Cabot Corporation was used. The slurry was supplied at a rate of 120 mL/min. Then, the polishing rate (a) at this time was measured.

Meanwhile, the multilayer polishing pad was left in a damp state for 24 hours. Then, the polishing rate (b) of the multilayer polishing pad that had been left in a damp state for 24 hours was also measured under the same conditions. Then, as an index of the change over time of the polishing rate, the retention ((b)/(a)×100(%)) of the polishing rate (b) of the multilayer polishing pad after being damped to the polishing rate (a) of the multilayer polishing pad before being damped was determined.

(Polishing Nonuniformity)

The film thickness of the silicon wafer before and after polishing was measured at 49 points in the wafer surface. Then, the polishing rate was determined from the difference in film thickness before and after polishing at each point. Then, the average value of the polishing rates at the 49 points was determined as a polishing rate (R). In addition, the standard deviation (σ) on the polishing rates at the 49 points was determined, and the polishing nonuniformity was determined from "Nonuniformity (%)=(σ/R)×100". Smaller values for the nonuniformity indicate a better polishing uniformity.

(Burr Generation Evaluation)

The multilayer polishing pad was attached to an electric potter's wheel-type polishing machine (RK-3D type) manufactured by Nidec-Shimpo Corporation. Then, the polishing surface of the polishing pad was ground for 8 hours by using a diamond dresser under the conditions: a dresser rotation rate of 61 rpm, a polishing pad rotation rate of 60 rpm, and a dresser load of 2.75 psi, while pouring a slurry at a rate of 150 mL/min. As the diamond dresser, a diamond dresser (diamond particle grit number #100) manufactured by A.L.M.T. Corp. was used. The ground polishing surface was visually observed, and the test piece in which no burr was generated was rated as good, and the test piece in which burrs were generated was rated as poor.

The results are collectively shown in Table 1.

TABLE 1

| | | Example No. | | | | | | | | | | | | |
|---|---|---|---|---|---|---|---|---|---|---|---|---|---|---|
| | | 1 | 2 | 3 | 4 | 5 | 6 | 7 | 8 | Com. Ex. 1 | Com. Ex. 2 | Com. Ex. 3 | Com. Ex. 4 | Com. Ex. 5 |
| Resin composition | Polymer polyol | PTMG 850 | PTMG 850/ PEG 800 | PTMG 850 | PEG 600 | PTMG 850 | PTMG 850 | PTMG 850 | PPG 950 | PTMG 650 | PMPA 500 | PMPA 1000 | PTMG 850 | PMPA 500 |
| | Chain extender(s) (number of carbon atoms) | BD(4)/MPD(6) | BD/MPD | BD/MPD | BD/MPD | BD/HD(6) | BD/OD(8) | BD/CHDM(8) | BD/MPD | BD | BD | BD | MPD | CHDM |
| | Organic diisocyanate | MDI | MDI | MDI | MDI | MDI | MDI | MDI | MDI | MDI | MDI | MDI | MDI | MDI |
| Content of nitrogen atoms derived from isocyanate group (wt %) | | 6.7 | 6.7 | 7.3 | 7.3 | 6.7 | 6.7 | 6.7 | 6.7 | 6.9 | 6.5 | 6.0 | 6.7 | 6.5 |
| Melting point (° C.)/ΔH (J/g) | | 177/10 | 173/11 | 179/15 | 174/10 | 178/5 | 180/10 | 179/9 | 175/14 | 190–210/25 | 200/20 | 212/20 | Amorphous | Amorphous |
| Contact angle with water (degrees) | | 70 | 68 | 72 | 70 | 70 | 71 | 71 | 71 | 71 | 70 | 71 | 70 | 77 |
| Density (g/cm) | | 1.2 | 1.2 | 1.2 | 1.2 | 1.2 | 1.2 | 1.2 | 1.2 | 1.2 | 1.2 | 1.2 | 1.2 | 0.7 |
| Hardness (JIS-D hardness) | | 82 | 80 | 84 | 84 | 80 | 80 | 82 | 81 | 80 | 83 | 74 | 80 | 65 |
| Tensile modulus at 50° C. after swollen to saturation with 50° C. water (MPa) | | 380 | 270 | 1280 | 640 | 350 | 330 | 400 | 500 | 812 | 500 | 260 | 100 | 280 |
| Storage modulus (A) at 50° C. after swollen to saturation with 50° C. water (MPa) | | 580 | 480 | 1370 | 1050 | 550 | 500 | 600 | 780 | 1110 | 510 | 430 | 120 | 370 |
| Storage modulus (B) at 50° C. (MPa) | | 825 | 840 | 1660 | 1740 | 840 | 800 | 850 | 1330 | 1400 | 1500 | 580 | 550 | 450 |
| Storage modulus retention (%) ((A/B) × 100) | | 70 | 57 | 83 | 60 | 65 | 63 | 71 | 59 | 79 | 34 | 74 | 22 | 82 |
| Taper at groove shoulder portions | | Present | Present | Present | Present | Present | Present | Present | Present | Present | Present | Absent | Present | Absent |
| Moldability | | A | A | A | A | A | A | A | A | C-B | C-B | B | A | A |
| Nonuniformity (%) | | 3 | 3 | 3 | 4 | 3 | 3 | 3 | 2 | 3 | 5 | 9 | 9 | 6 |
| Change over time of polishing rate (%) | | 99 | 98 | 99 | 98 | 98 | 99 | 99 | 99 | 98 | 93 | 96 | 92 | 97 |
| Burr generation evaluation | | Good | Good | Good | Good | Good | Good | Good | Good | Good | Good | Good | Good | Good |

Example 2

A monomer obtained by mixing PTMG 850, a polyethylene glycol (PEG 600) having a number average molecular weight of 600, BD, MPD, and MDI at a ratio of PTMG 850:PEG 600:BD:MPD:MDI=11.4:7.6:14.7:6.4:59.9 (mass ratio) was provided. Then, the monomer was continuously supplied into a twin-screw extruder by using a metering pump, while being kneaded, and was subjected to continuous melt polymerization, to give a polymer. A strand of the molten polymer continuously discharged from the twin-screw extruder was continuously extruded into water, and was thereafter finely cut with a pelletizer, to give pellets of a thermoplastic polyurethane B.

The same evaluation as in Example 1 was performed except for using the thermoplastic polyurethane B in place of the thermoplastic polyurethane A. The results are shown in Table 1.

Example 3

A monomer obtained by mixing PTMG 850, BD, MPD, and MDI at a ratio of PTMG 850:BD:MPD:MDI=10.2:15.7:8.8:65.3 (mass ratio) was provided. Then, the monomer was continuously supplied into a twin-screw extruder by using a metering pump, while being kneaded, and was subjected to continuous melt polymerization, to give a polymer. A strand of the molten polymer continuously discharged from the twin-screw extruder was continuously extruded into water, and was thereafter finely cut with a pelletizer, to give pellets of a thermoplastic polyurethane C.

The same evaluation as in Example 1 was performed except for using the thermoplastic polyurethane C in place of the thermoplastic polyurethane A. The results are shown in Table 1.

Example 4

A monomer obtained by mixing PEG 600, BD, MPD, and MDI at a ratio of PEG 600:BD:MPD:MDI=10.9:15.3:8.6:65.2 (mass ratio) was provided. Then, the monomer was continuously supplied into a twin-screw extruder by using a metering pump, while being kneaded, and was subjected to continuous melt polymerization, to give a polymer. A strand of the molten polymer continuously discharged from the twin-screw extruder was continuously extruded into water, and was thereafter finely cut with a pelletizer, to give pellets of a thermoplastic polyurethane D.

The same evaluation as in Example 1 was performed except for using the thermoplastic polyurethane D in place of the thermoplastic polyurethane A. The results are shown in Table 1.

Example 5

A monomer obtained by mixing PTMG 850, BD, 1,6-hexanediol (HD) serving as a chain extender having 6 carbon atoms, and MDI at a ratio of PTMG 850:BD:HD:MDI=19.0:14.7:6.4:59.9 (mass ratio) was provided. Then, the monomer was continuously supplied into a twin-screw extruder by using a metering pump, while being kneaded, and was subjected to continuous melt polymerization, to give a polymer. A strand of the molten polymer continuously discharged from the twin-screw extruder was continuously extruded into water, and was thereafter finely cut with a pelletizer, to give pellets of a thermoplastic polyurethane E.

The same evaluation as in Example 1 was performed except for using the thermoplastic polyurethane E in place of the thermoplastic polyurethane A. The results are shown in Table 1.

Example 6

A monomer obtained by mixing PTMG 850, BD, 1,8-octanediol (OD) serving as a chain extender having 8 carbon atoms, and MDI at a ratio of PTMG 850:BD:OD:MDI=17.3:14.8:8.0:59.9 (mass ratio) was provided. Then, the monomer was continuously supplied into a twin-screw extruder by using a metering pump, while being kneaded, and was subjected to continuous melt polymerization, to give a polymer. A strand of the molten polymer continuously discharged from the twin-screw extruder was continuously extruded into water, and was thereafter finely cut with a pelletizer, to give pellets of a thermoplastic polyurethane F.

The same evaluation as in Example 1 was performed except for using the thermoplastic polyurethane F in place of the thermoplastic polyurethane A. The results are shown in Table 1.

Example 7

A monomer obtained by mixing PTMG 850, BD, cyclohexanedimethanol (CHDM) serving as a chain extender having 8 carbon atoms, and MDI at a ratio of PTMG 850:BD:CHDM:MDI=14.4:14.8:7.9:59.9 (mass ratio) was provided. Then, the monomer was continuously supplied into a twin-screw extruder by using a metering pump, while being kneaded, and was subjected to continuous melt polymerization, to give a polymer. A strand of the molten polymer continuously discharged from the twin-screw extruder was continuously extruded into water, and was thereafter finely cut with a pelletizer, to give pellets of a thermoplastic polyurethane G.

The same evaluation as in Example 1 was performed except for using the thermoplastic polyurethane G in place of the thermoplastic polyurethane A. The results are shown in Table 1.

Example 8

A polypropylene glycol (PPG 950) having a number average molecular weight of 950, BD,MPD, and MDI were mixed at a ratio of PPG 950:BD:MPD:MDI=18.7:14.8:6.5:59.9 (mass ratio), and the mixture was continuously supplied into a coaxially rotating twin-screw extruder by using a metering pump, and was subjected to continuous melt polymerization. A melt of the mixture was continuously extruded in the form of a strand into water, and was thereafter finely cut with a pelletizer, to give pellets of a thermoplastic polyurethane H.

The same evaluation as in Example 1 was performed except for using the thermoplastic polyurethane H in place of the thermoplastic polyurethane A. The results are shown in Table 1.

Comparative Example 1

A monomer obtained by mixing a polytetramethylene glycol (PTMG 650) having a number average molecular weight of 650, BD, and MDI at a ratio of PTMG 650:BD:MDI=18.7:19.6:61.7 (mass ratio) was provided. Then, the monomer was continuously supplied into a twin-screw extruder by using a metering pump, while being kneaded, and was subjected to continuous melt polymerization, to give a polymer. A strand of the molten polymer continuously discharged from the twin-screw extruder was continuously extruded into water, and was thereafter finely cut with a pelletizer, to give pellets of a thermoplastic polyurethane I.

The same evaluation as in Example 1 was performed except for using the thermoplastic polyurethane I in place of the thermoplastic polyurethane A. The results are shown in Table 1.

Comparative Example 2

A monomer obtained by mixing poly-3-methylpentanediol adipate (PMPA 500) having a number average molecular weight of 500, BD, and MDI at a ratio of PMPA 500:BD:MDI=25.6:16.3:58.1 (mass ratio) was provided. Then, the monomer was continuously supplied into a twin-screw extruder by using a metering pump, while being kneaded, and was subjected to continuous melt polymerization, to give a polymer. A strand of the molten polymer continuously discharged from the twin-screw extruder was continuously extruded into water, and was thereafter finely cut with a pelletizer, to give pellets of a thermoplastic polyurethane J.

The same evaluation as in Example 1 was performed except for using the thermoplastic polyurethane J in place of the thermoplastic polyurethane A. The results are shown in Table 1.

Comparative Example 3

A monomer obtained by mixing poly-3-methylpentanediol adipate (PMPA 1000) having a number average molecular weight of 1000, BD, and MDI at a ratio of PMPA 1000:BD:MDI=29.7:16.6:53.7 (mass ratio) was provided. Then, the monomer was continuously supplied into a twin-screw extruder by using a metering pump, while being kneaded, and was subjected to continuous melt polymerization, to give a polymer. A strand of the molten polymer continuously discharged from the twin-screw extruder was continuously extruded into water, and was thereafter finely cut with a pelletizer, to give pellets of a thermoplastic polyurethane K.

The same evaluation as in Example 1 was performed except for using the thermoplastic polyurethane K in place of the thermoplastic polyurethane A. Note that in Comparative Example 3, no tapered shape was formed at opposite corner portions of the concentrically formed grooves. The results are shown in Table 1.

Comparative Example 4

A monomer obtained by mixing PTMG 850, MPD, and MDI at a ratio of PTMG 850:MPD:MDI=13.7:26.4:59.9 (mass ratio) was provided. Then, the monomer was continuously supplied into a twin-screw extruder by using a metering pump, while being kneaded, and was subjected to continuous melt polymerization, to give a polymer. A strand of the molten polymer continuously discharged from the twin-screw extruder was continuously extruded into water, and was thereafter finely cut with a pelletizer, to give pellets of a thermoplastic polyurethane L.

The same evaluation as in Example 1 was performed except for using the thermoplastic polyurethane L in place of the thermoplastic polyurethane A. The results are shown in Table 1.

Comparative Example 5

PMPA 500, CHDM, and MDI were mixed at a ratio of PMPA 500:CHDM:MDI=11.8:30.1:58.1 (mass ratio), and the mixture was continuously supplied into a coaxially rotating twin-screw extruder by using a metering pump, and was subjected to continuous melt polymerization. A melt of the mixture was continuously extruded in the form of a strand into water, and was thereafter finely cut with a pelletizer, to give pellets of a thermoplastic polyurethane M.

The content ratio of nitrogen, the differential scanning calories, the contact angle with water, the tensile modulus at 50° C. when swollen to saturation with 50° C. water, and the storage modulus retention when swollen to saturation with water were evaluated in the same manner as in Example 1, except for using the thermoplastic polyurethane M in place of the thermoplastic polyurethane A.

The thermoplastic polyurethane M was sandwiched between two metal plates, and hot press-molded, to give a hot press-molded sheet. Then, the hot press-molded sheet was placed in a pressure-resistant container, and carbon dioxide was dissolved therein at a temperature of 110° C. and a pressure of 7 MPa for 5 hours, to give a dissolved gas-containing sheet containing 1.6 wt % (saturation amount) carbon dioxide. Then, after cooling to room temperature, the pressure was returned to normal pressure, and the dissolved gas-containing sheet was taken out from the pressure-resistant container. Then, the resulting dissolved gas-containing sheet was immersed in silicone oil at 110° C. for 3 minutes, was thereafter taken out, and was cooled to room temperature, to give a foamed sheet of the polyurethane M having a thickness of 2 μm.

Then, using the obtained foamed sheet of the polyurethane M, the density, the hardness, the moldability, and the polishing characteristics were evaluated. Note that in Comparative Example 5, no tapered shape was formed at opposite corner portions of the concentrically formed grooves. The results are shown in Table 1.

From the results shown in Table 1, the following can be understood. The polishing pads obtained in Examples 1 to 8, each of which included, as a polishing layer, a molded body of a thermoplastic polyurethane polymerized by using chain extenders including a diol having 4 or less carbon atoms and a diol having 5 or more carbon atoms, had an excellent polishing nonuniformity during wafer polishing, underwent a little change over time of the polishing rate, and had an excellent moldability. On the other hand, the polishing pads obtained in Comparative Example 1 and Comparative Example 2, each of which included, as a polishing layer, a molded body of a thermoplastic polyurethane polymerized by using only BD having 4 carbon atoms as a sole chain extender, had an excellent polishing uniformity during wafer polishing due to their high hardnesses, but had a poor moldability. The polishing pad obtained in Comparative Example 3, which was a molded body of a thermoplastic polyurethane polymerized by using only BD having 4 carbon atoms as a sole chain extender, and having a content ratio of nitrogen derived from the isocyanate group in the organic diisocyanate, of less than 6.3, had a low polishing uniformity due to its low hardness, underwent a significant change over time of the polishing rate, and had a poor moldability. The polishing pad obtained in Comparative Example 4, which included, as a polishing layer, a molded body of a thermoplastic polyurethane polymerized by using only MPD having 5 carbon atoms as a sole chain extender, had an excellent moldability, but had a low polishing uniformity due to its low hardness, underwent a significant change over time of the polishing rate, and had a poor moldability. The porous polishing pad obtained in Comparative Example 5, which included, as a polishing layer, a foamed molded body of a thermoplastic polyurethane, had a low polishing uniformity due to its low hardness.

REFERENCE SIGNS LIST

10. ... Polishing pad
11. ... Rotary platen
12. ... Slurry supply nozzle
13. ... Carrier
14. ... Pad conditioner
15. ... Material to be polished
16. ... Polishing slurry
20. ... CMP apparatus

The invention claimed is:

1. A polishing-layer molded body, comprising a thermoplastic polyurethane that is a polymer of monomer units including:
    a polymer diol;
    an organic diisocyanate;
    a first chain extender including a diol having 4 or less carbon atoms; and
    a second chain extender including a diol having 5 or more carbon atoms, wherein:
    a content ratio of nitrogen derived from an isocyanate group of the organic diisocyanate is 6.3 to 7.4 mass %; and
    the polishing-layer molded body is non-porous.

2. The polishing-layer molded body according to claim 1, wherein:
    the first chain extender comprises at least one selected from the group consisting of ethylene glycol, 1,3-propanediol, 1,2-butanediol, 1,3-butanediol, 2,3-butanediol, 1,4-butanediol, and 2-methyl-1,3-propanediol; and
    the second chain extender comprises at least one selected from the group consisting of 1,5-pentanediol, 2,2-dimethylpropane-1,3-diol, 3-methyl-1,5-pentanediol, 1,6-hexanediol, cyclohexanediol, 1,8-octanediol, cyclohexanedimethanol, 1,9-nonanediol, 2-methyl-1,8-octanediol, and 1,10-decanediol.

3. The polishing-layer molded body according to claim 1, wherein the thermoplastic polyurethane has an endothermic peak at 185° C. or less as measured by differential scanning calorimetry (DSC), and has a crystallization enthalpy ($\Delta H$) of 2 to 15J/g as determined from an endothermic peak area at the endothermic peak.

4. The polishing-layer molded body according to claim 1, wherein the polishing-layer molded body comprises the first chain extender and the second chain extender that have a difference in number of carbon atoms of 2 or more.

5. The polishing-layer molded body according to claim 1, wherein the polishing-layer molded body has a density of 1.0 g/cm$^3$ or more and a JIS-D hardness of 75 or more.

6. The polishing-layer molded body according to claim 1, which includes a surface having a contact angle with water of 75 degrees or less.

7. The polishing-layer molded body according to claim 1, wherein the thermoplastic polyurethane has a tensile modulus at 50° C. when swollen to saturation with 50° C. warm water, of 250 to 1500MPa.

8. The polishing-layer molded body according to claim 1, wherein the thermoplastic polyurethane has a storage modulus retention when swollen to saturation with water, of 55% or more, as calculated from the following expression:

$$A/B \times 100,$$

where A represents a storage modulus at 50° C. when swollen to saturation with 50° C. warm water, and B represents a storage modulus at 50° C. when not swollen to saturation with 50° C. warm water.

9. The polishing-layer molded body according to claim 1, wherein the polymer diol comprises at least one selected from the group consisting of polyethylene glycol, polypropylene glycol, polytetramethylene glycol, and polymethyltetramethylene glycol.

10. The polishing-layer molded body according to claim 1, wherein:
    the polishing-layer molded body includes a polishing surface having a recess; and
    the recess has a tapered corner portion extending toward the polishing surface.

11. A polishing pad, comprising the polishing-layer molded body according to claim 1 as a polishing layer.

12. The polishing pad according to claim 11, wherein a cushioning layer having a hardness lower than a hardness of the polishing layer is stacked thereon.

* * * * *